United States Patent [19]

Braun

[11] Patent Number: 4,631,497
[45] Date of Patent: Dec. 23, 1986

[54] INJECTION LOCKED RF OSCILLATOR WITH CONTROL HOOP

[75] Inventor: Robin M. Braun, Cape Town, South Africa

[73] Assignee: Plessey South Africa Limited, Cape Province, South Africa

[21] Appl. No.: 739,695

[22] Filed: May 31, 1985

[30] Foreign Application Priority Data

Jun. 5, 1984 [ZA] South Africa ..................... 84/4213

[51] Int. Cl.⁴ .......................... H03L 7/12; H03L 7/24
[52] U.S. Cl. ........................................ 331/4; 331/10; 331/25; 331/36 C; 331/107 DP; 331/177 V
[58] Field of Search ....................... 331/1 R, 4, 10, 18, 331/25, 30, 34, 36 C, 96, 107 DP, 107 G, 172, 177 V

[56] References Cited

U.S. PATENT DOCUMENTS

| | | | |
|---|---|---|---|
| 2,972,720 | 2/1961 | Hume | 331/59 X |
| 3,534,284 | 10/1970 | Beurrier | 331/10 |
| 3,534,285 | 10/1970 | Kobold et al. | 331/10 |
| 3,832,713 | 8/1974 | Rubin | 331/17 X |
| 3,878,474 | 4/1975 | Runge | 331/10 |
| 4,297,648 | 10/1981 | Tucker et al. | 331/1 R |

OTHER PUBLICATIONS

"New Modular Concept for Phase Locked RF Oscillators" by Bernhard et al.,–(published in the Conference Proceedings of the 11th European Microwave Conference, 7 to 10 Sep. 1981, Amsterdam, paper P11, pp. 584 et seq.).

Primary Examiner—Siegfried H. Grimm
Attorney, Agent, or Firm—Fleit, Jacobson, Cohn & Price

[57] ABSTRACT

An injection locked RF oscillator comprises a variable frequency RF source 12 having a Gunn diode 20 and a varactor 22, and a frequency stable reference oscillator 14 whose output $f_i$ is injected into the source to cause injection locking of the source. The output of a low frequency perturbation oscillator 30 is applied to the varactor and the resultant variation in the current consumption $I_o$ of the Gunn diode detected by amplifier 28 and filter 36 to provide a control signal which is effective to shift the resonant frequency $f_o$ of the source 12 towards the frequency $f_i$ of the reference oscillator, or a harmonic thereof. A sweep-and-lock circuit 44 is provided to acquire injection locking upon switch-on.

9 Claims, 4 Drawing Figures

INJECTION LOCKED RF OSCILLATOR WITH CONTROL HOOP

BACKGROUND OF THE INVENTION

This invention relates to an injection locked RF oscillator, and to a method of generating RF energy.

It is known that if a signal having a frequency close to the free running or resonance frequency of an oscillator is injected into the oscillator, the oscillator will phase-lock onto the injected signal. The phenomenon is known as injection locking. The same applies where the signal being injected has a harmonic which is close to the resonance frequency of the oscillator. In this event the oscillator will phase-lock onto the harmonic in question.

The resonance frequency of an RF source may be affected by a number of factors. One of these, for example, is temperature. A difficulty hitherto experienced with injection locking of an RF source is that, to increase the lock range—i.e. the range of resonance frequencies over which the system will hold lock once lock has been acquired—the power of the injected signal has to be increased. The injected power required to enable a system to hold lock in most applications was such as to render injection locking impractical as a means of frequency stabilizing an RF source.

It is an object of the invention to provide an injection locked RF oscillator which has a wide lock range without requiring an excessive amount of injected power.

SUMMARY OF THE INVENTION

According to the invention there is provided an injection locked RF oscillator, which comprises:

an RF source having a variable resonance frequency, for generating RF output power;

a reference oscillator for generating a reference signal having a reference frequency, and for injecting the reference signal into the RF source, thereby to cause injection locking of the RF source onto a lock frequency equal to the reference frequency or a harmonic of the reference frequency; and a control loop comprising sensing means for sensing a parameter which varies in accordance with the difference between the lock frequency and the resonance frequency, and control means which is operative in response to the sensing means to control the resonance frequency.

Said parameter may be the current consumption of the RF source.

The RF source may include a two-terminal negative resistance device, e.g. a Gunn diode.

The oscillator may further comprise means for sweeping the RF source through its frequency range upon switch-on, until injection lock has been acquired.

The oscillator may further comprise a perturbation generator for causing a perturbation in the resonance frequency, said sensing means being in the form of detecting means for detecting the resulting variation in said parameter in relation to the variation in the resonance frequency, and the control means being operative in response to the detecting means to provide a control signal for changing the resonance frequency towards the lock frequency.

The perturbation generator may be in the form of an oscillator for causing continuous sinusoidal perturbation, at a perturbation frequency, of the resonance frequency, the detecting means comprising means for detecting a sinusoidal variation at the perturbation frequency in said parameter.

The invention extends to a method of generating RF energy, which comprises:

causing an RF source having a variable resonance frequency to generate RF output power;

injecting a reference signal having a reference frequency into the RF source and causing injection locking of the RF source onto a lock frequency equal to the reference frequency or a harmonic of the reference frequency;

sensing a parameter which varies in accordance with the difference between the lock frequency and the resonance frequency; and in response to said sensing, controlling the resonance frequency of the RF source.

The invention will now be described in more detail, by way of example, with reference to the accompanying drawings.

DETAILED DESCRIPTION

Figure 1:
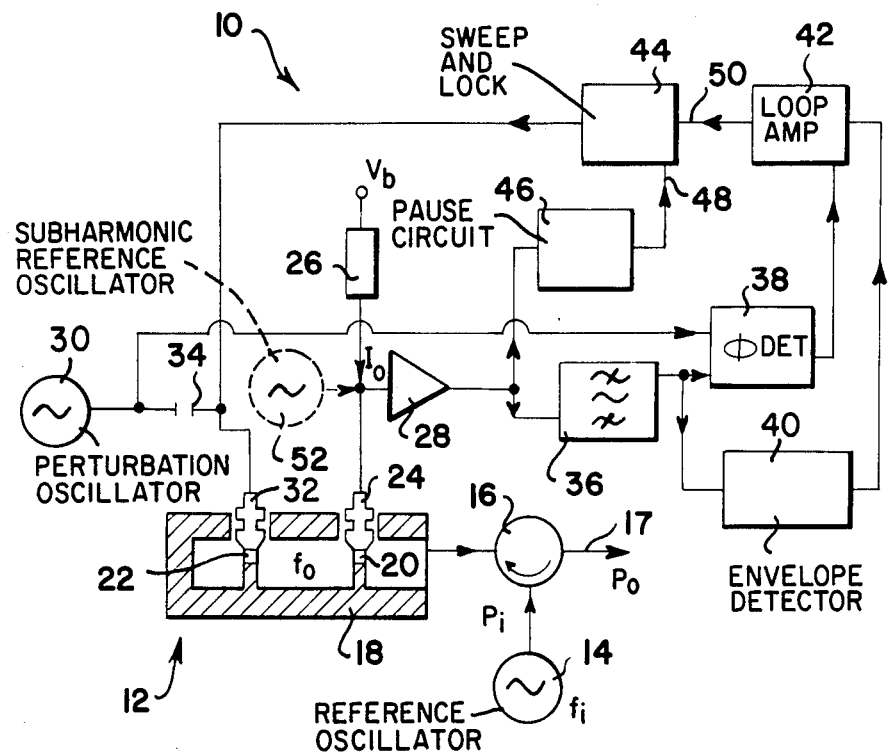
FIG. 1 is a schematic block diagram of a injection locked microwave oscillator in accordance with a first embodiment of the invention.

Referring first to FIG. 1, reference numeral 10 generally designates an injection locked microwave oscillator, the oscillator comprising a variable frequency microwave source 12 which could have a frequency of, say, about 35 GHz, a microwave reference oscillator 14, and a circulator 16. The circulator 16 is arranged to inject the output of the reference oscillator 14 into the source 12, while passing the output of the source to an output port 17. The microwave source 12 comprises a waveguide cavity resonator 18 having a Gunn diode 20 and a varactor 22 mounted therein in conventional manner.

The requisite bias voltage $V_b$ is applied to terminal 24 of the Gunn diode 20 via a dropper resistor 26. The terminal 24 is connected to the input of an amplifier 28 which is operative to sense the voltage on the terminal 24, and to provide a dc output which varies in accordance with the current consumption $I_o$ of the microwave source.

The oscillator 10 further comprises a perturbation oscillator 30 whose output is coupled to terminal 32 of the varactor 22 via a coupling capacitor 34. The oscillator 30 would typically have a frequency of about 10 kHz.

The oscillator 10 further comprises a narrow band filter 36 whose centre frequency corresponds to the frequency of the perturbation oscillator 30, a phase detector 38, an envelope detector 40, a loop amplifier 42, a sweep-and-lock circuit 44, and a pause circuit 46, these being interconnected as shown in the drawing.

Operation of the oscillator 10 is as follows. Upon switch-on, the sweep-and-lock circuit 44 operates to apply a ramp voltage to the terminal 32 of the varactor 22, thereby sweeping the source 12 through its frequency range. The output of the reference oscillator 14 is continuously injected into the cavity 18 via the circulator 16. Initially, the source 12 will oscillate in the free-running mode at a free-running or resonance frequency $f_o$ which is determined by the voltage applied to the terminal 32 and which differs from the frequency $f_i$ of the reference oscillator 14. As the difference $\Delta f$ between the resonance frequency $f_o$ and the reference frequency $f_i$ moves to within the injection lock capture range of the system, the source locks onto the reference signal, whereupon the frequency of the source 12 is determined by the reference frequency $f_i$ and no longer by the voltage applied to the terminal 32. As the source locks onto the reference signal the current consumption $I_o$ of the source 12 will rapidly increase. This rapidly increasing current is detected by the pause circuit 46, which then operates to hold or lock the sweep-and-lock circuit 44 via its input 48, although the output of the circuit 44 can still be controlled by the application of a signal to its input 50.

Figure 2:
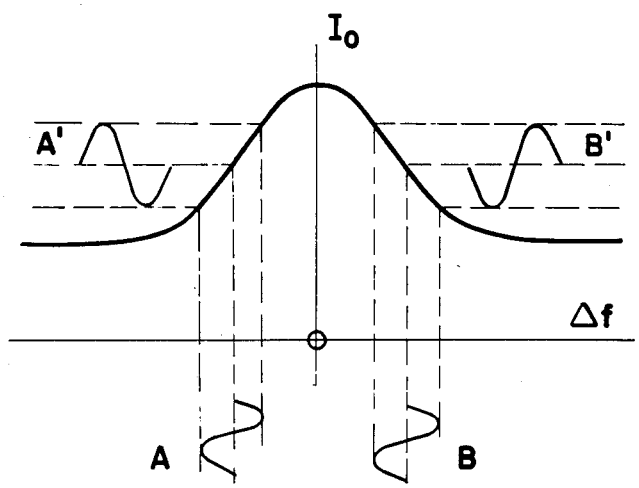
FIG. 2 is a graph illustrating the operation of the oscillator.

FIG. 2 is a plot which shows the current consumption $I_o$ against $\Delta f$ during the continuance of frequency lock. It will be seen that this exhibits a peak when $\Delta f = 0$.

The ability of the source to lock onto the injected signal depends on various factors and can be expressed as follows, namely that injection locking will occur if:

$$\Delta f < \frac{f_o}{2Q} \sqrt{\frac{P_i}{P_o}}$$

where $P_i$ is the injected power
$P_o$ is the free-running power of the source
$Q$ is the quality factor of the source cavity
$\Delta f = f_o - f_i$
$f_o$ is the resonance frequency of the source, and
$f_i$ is the frequency of the reference oscillator.

This is what is known as a first order system. The capture range as well as the lock range for such a system is twice the maximum value of $\Delta f$. The capture range is the range of frequencies over which the system will capture lock, whereas the lock range is the range of frequencies over which the system will hold lock, once lock has been acquired.

When the source operates in the injection locked mode, the effect of the sinusoidal modulation signal applied by the perturbation oscillator 30 to the varactor 22 is to cause a sinusoidal variation of the current consumption $I_o$. This is illustrated in FIG. 2, where the curve A represents the instantaneous output of the perturbation oscillator, and the curve A' the instantaneous value of the current consumption $I_o$—that is, where the frequency $f_o$ is less than the frequency $f_i$. If the frequency $f_o$ is greater than the frequency $f_i$, the output of the perturbation oscillator and the instantaneous value of the current consumption $I_o$ would be as illustrated by the curves B and B' respectively. It will be noted that the phase of $I_o$ with respect to the modulation signal is 0° or 180° depending on whether $f_i$ is less than or greater than $f_o$, whereas the amplitude of the sinusoidal component of $I_o$ depends on the slope of the $I_o$ versus $\Delta f$ curve.

The operaton of the phase detector 38 is such that its output is high or low depending on whether the output of the filter 36 is in or out of phase with the output of the perturbation oscillator 30. The envelope detector 40 is operative to provide an output whose magnitude corresponds to the amplitude of the sinusoidal component of $I_o$. The loop amplifier 42 is operative to provide inverting or non-inverting amplification of the output of the envelope detector 40, the sense of amplification depending on whether the output of the phase detector 38 is high or low. Finally, the output of the sweep-and-lock circuit 44 in response to the output of the loop amplifier 42 is such as to increase the resonance frequency $f_o$ of the source 12 when the output of the filter 36 is in phase with that of the perturbation oscillator 30, and to decrease the resonance frequency when the two outputs are 180° out of phase. In this way the resonance frequency of the source 12 is automatically controlled to maintain the output of the envelope detector 40 at a minimum, which is the case when $f_o = f_i$. As the difference between $f_o$ and $f_i$ is small one needs only a very low injected power to maintain injection locking.

In a particularly advantageous embodiment of the invention, the microwave reference oscillator 14 and the circulator 16 are done away with and replaced by a sub-harmonic reference oscillator 52 (shown dotted) whose output is injected into the source 12 via the terminal 24. The reference oscillator may, in this event, conveniently be a frequency stable crystal controlled oscillator. Due to the non-linear characteristic of the Gunn diode, harmonics of the reference frequency are generated, and injection locking takes place with respect to one of these harmonics.

With such sub-harmonic injection, the ratio of power ($P_i$) injected at the relevant harmonic frequency to that ($P_i'$) injected at the fundamental frequency is about equal to the square of ratio of fundamental frequency ($f_i$) to the harmonic frequency (approximately $f_o$) Thus $$P_i \approx P_i'(f_i/f_o)^2$$

Where $f_i/f_o \approx n$, the harmonic number

Thus $$P_i \approx P_i'/n^2$$

Accordingly, the lock range, and thus also the capture range of an oscillator with sub-harmonic injection is reduced by a factor of n in comparison with that of an oscillator with fundamental injection, with the same injected power.

On the other hand, with the control loop illustrated in FIG. 1, the lock range is effectively extended to the entire tuning range of the oscillator. The loss in capture range is easily compensated for by the sweep generator forming part of the sweep-and-lock circuit 44.

The oscillator 10 can, for example, be used in a pulsed radar system. One problem with pulsed oscillators is that heating effects during the period of the pulse cause the frequency to shift in an uncontrolled way during the pulse. This effect is also known as chirp. The result is that the pulse is distorted and range resolution as a result degraded.

The oscillator 10 may be used in a pulsed system whose pulse rate is at least twice as high as the bandpass of the external control loop constituted by items 36, 40 and 42. This loop would then cope with the environmental effects causing frequency change, while the frequency during the pulse would be controlled by the injection lock process.

The frequency of the reference signal $f_i$ may be kept constant during the pulse and the pulse would then have a chirp of 0. Alternatively, $f_i$ may be chirped in a controlled way, in which event the locked source will follow $f_i$, giving a controlled chirp pulse with advantages to range resolution.

Figure 3:
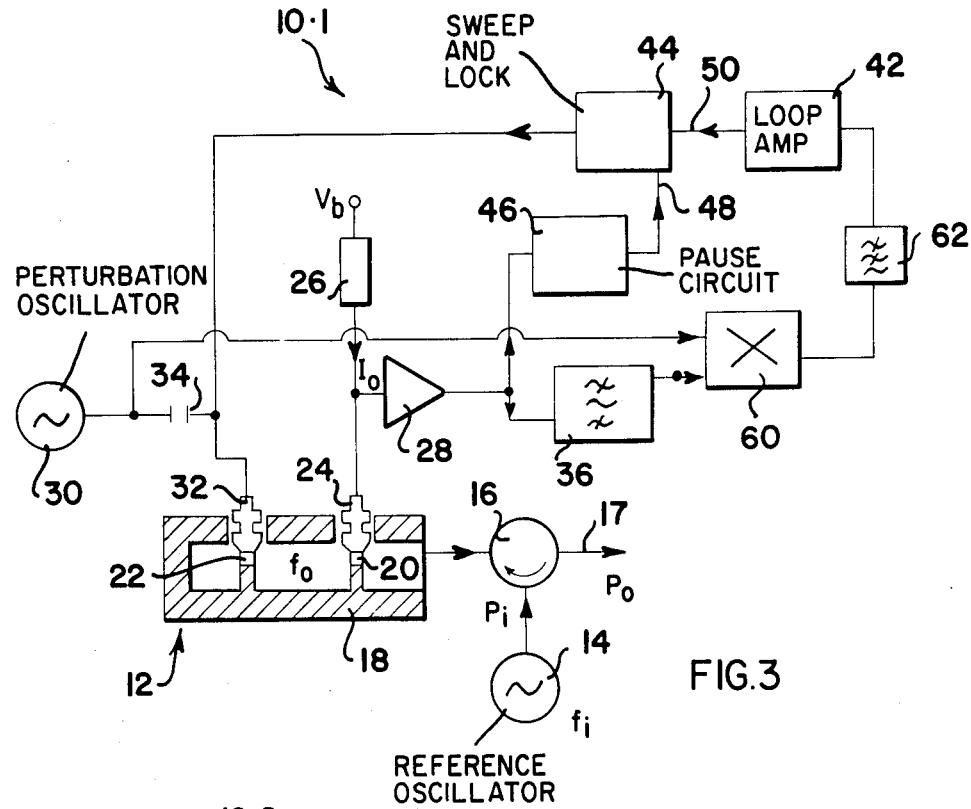
FIG. 3 is a schematic block diagram of a microwave oscillator in accordance with a second embodiment of the invention.

Referring now to FIG. 3, reference numeral 10.1 generally indicates a microwave oscillator which is similar to the one shown in FIG. 1, the same reference numerals being used to indicate the same parts. The oscillator 10.1 differs from the oscillator 10 in that the phase detector 38 and the envelope detector 40 are substituted by a multiplier 60 and a low pass filter 62. (It will be appreciated that the low pass filter 62 may form an integral part of, for example, the loop amplifier 42). The multiplier 60 is operative to multiply the instantaneous values of the outputs of the perturbation oscillator 30 and the amplifier 28 respectively. The output of the multiplier 60 is fed via the low pass filter 62 to the loop amplifier 42.

It is known that the multiplication of two sinusoidally varying signals of the same frequency produces an output signal having a double frequency ac component superimposed on a dc component. The ac component is filtered out by the low pass filter 62. The dc component can be expressed mathematically as $$V_o = \frac{Vm \cdot k \cdot \Delta f \cos\phi}{2}$$

where

Vm is the amplitude of the output of oscillator 30 (i.e. the one input to the multiplier)

$\Delta f$ is as defined above k is a factor relating the amplitude of the output of the band pass filter 36 (i.e. the other input to the multiplier) to $\Delta f$ $\phi$ is the phase difference between the two inputs to the multiplier.

Thus Vo is a maximum when $\phi$ is 0° and 180° and changes sign when $\phi$ is +90° and −90°. The arrangement of FIG. 3 thus provides substantially the same end result as the arrangement of FIG. 1, while making it possible to use a simpler amplifier 42 which does not need to have an inversion capability.

An oscillator according to the invention can also be used as a self-mixing receiver. A configuration suitable for this purpose is illustrated in FIG. 4, where reference numeral 10.2 generally indicates a microwave oscillator which is similar to the one shown in FIG. 1, the same reference numerals being used to indicate the same parts.

Such a configuration is also generically referred to as an autodyne configuration. It provides a signal which is the mixing product of the microwave source's own signal and another signal impinging on the source. In the configuration illustrated in FIG. 4 the product signal (IF) is collected from the power supply terminal 24 through the use of an extractor circuit 70 (of a type known in the art) which is connected between the terminal 24 and the power supply $V_b$. It will further be seen that the circulator 16 of FIG. 1 has been removed and replaced by a directional coupler 72 which will permit coupling of the received signal $P_r$ to the source 12.

Figure 4:
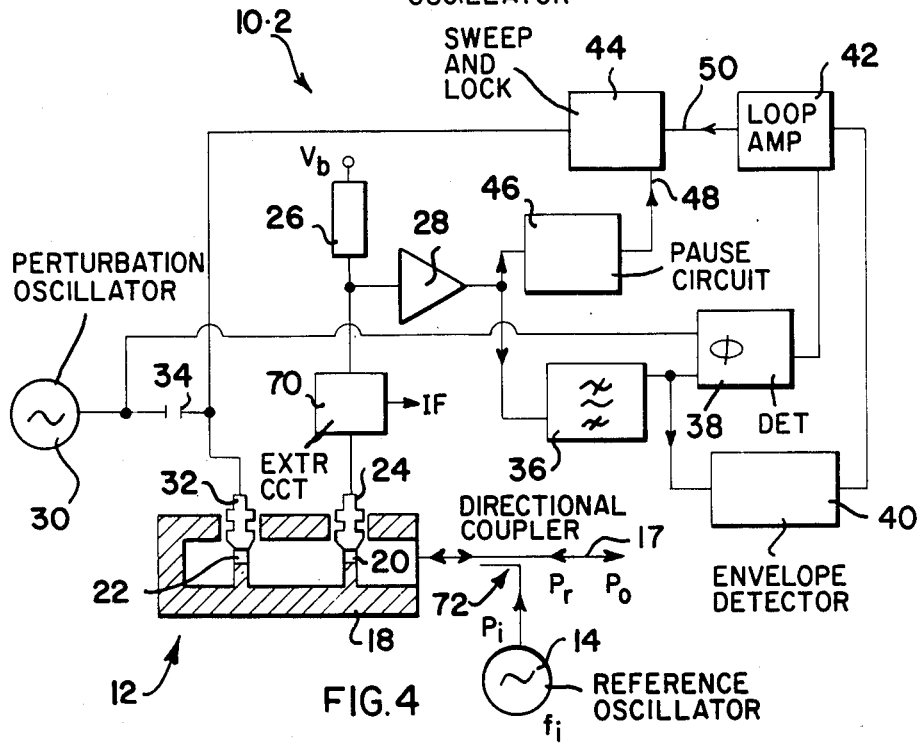
FIG. 4 is a schematic block diagram of a microwave oscillator in accordance with a third embodiment of the invention.

It will be appreciated that the frequency of the source 12 in the FIGS. 1, 3 and 4 embodiments may be controlled by controlling the power supply voltage to the Gunn diode 20. Thus, the varactor 22 can be omitted and the output of the sweep-and-lock circuit 44 used to regulate the power supply feeding the Gunn diode 20, and in this manner control the frequency of the source 12.

What is claimed is:

1. An injection locked RF oscillator, which comprises:
    an RF source having a variable resonance frequency, for generating RF output power;
    a reference oscillator for generating a reference signal having a reference frequency, and for injecting the reference signal into the RF source, thereby to cause injection locking of the RF source onto a lock frequency equal to the reference frequency or a harmonic of the reference frequency; and
    a control loop comprising sensing means for sensing a parameter which varies in accordance with the difference between the lock frequency and the resonance frequency, and control means which is operative in response to the sensing means to control the resonance frequency;
    said parameter being the current consumption of the RF source.

2. An oscillator as claimed in claim 1, wherein the RF source includes a two-terminal negative resistance device.

3. An oscillator as claimed in claim 2, wherein the two-terminal negative resistance device is a Gunn diode.

4. An oscillator as claimed in claim 1, which further comprises means for sweeping the RF source through its frequency range upon switch-on, until injection lock has been acquired.

5. An oscillator as claimed in claim 1, which further comprises a perturbation generator for causing a perturbation in the resonance frequency, said sensing means being in the form of detecting means for detecting the resulting variation in said parameter in relation to the variation in the resonance frequency, and the control means being operative in response to the detecting means to provide a control signal for changing the resonance frequency towards the lock frequency.

6. An oscillator as claimed in claim 5, wherein the perturbation generator is in the form of an oscillator for causing continuous sinusoidal perturbation, at a perturbation frequency, of the resonance frequency, and wherein the detecting means comprises means for detecting a sinusoidal variation at the perturbation frequency in said parameter.

7. A method of generating RF energy, which comprises:
    causing an RF source having a variable resonance frequency to generate RF output power;
    injecting a reference signal having a reference frequency into the RF source and causing injection locking of the RF source onto a lock frequency equal to the reference frequency or a harmonic of the reference frequency;
    sensing a parameter which varies in accordance with the difference between the lock frequency and the resonance frequency; and
    in response to said sensing, controlling the resonance frequency of the RF source;

said parameter being the voltage drop across a dropper resistor which caries input current to the RF source.

8. A method as claimed in claim 7, which includes causing a perturbation in the resonance frequency, said sensing comprising sensing the resulting variation in said parameter.

9. A method as claimed in claim 8, wherein the perturbation is a continuous sinusoidal perturbation, said sensing comprising detecting a sinusoidal variation of corresponding frequency in said parameter.

* * * * *